United States Patent
Tsuda

(10) Patent No.: US 6,825,667 B1
(45) Date of Patent: Nov. 30, 2004

(54) MAGNETIC RESONANCE IMAGING APPARATUS AND METHOD FOR MAINTAINING HIGH UNIFORMITY OF MAGNETIC FIELD IN MAGNETIC RESONANCE IMAGING APPARATUS

(75) Inventor: Munetaka Tsuda, Mito (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/535,241

(22) Filed: Mar. 27, 2000

(30) Foreign Application Priority Data

Mar. 26, 1999 (JP) ............................................. 11-083744
Dec. 16, 1999 (JP) ............................................. 11-357283

(51) Int. Cl.$^7$ ................................................ G01V 3/00
(52) U.S. Cl. ........................ 324/320; 324/319; 324/315
(58) Field of Search ................................. 324/315, 318, 324/307, 309, 321, 320, 319; 600/412, 410, 420

(56) References Cited

U.S. PATENT DOCUMENTS 4,663,592 A * 5/1987 Yamaguchi et al. ........ 324/315
5,378,987 A * 1/1995 Ishihara et al. ............. 324/315
6,194,899 B1 * 2/2001 Ishihara et al. ............. 324/315
6,252,405 B1 * 6/2001 Watkins et al. ............. 324/319

FOREIGN PATENT DOCUMENTS

GB         2219406 A     * 12/1989

* cited by examiner

*Primary Examiner*—Diego Gutierrez
*Assistant Examiner*—Tiffany A. Fetzner
(74) *Attorney, Agent, or Firm*—Cooper & Dunham LLP

(57) ABSTRACT

A magnetic resonance imaging apparatus includes a unit (shim coil) that corrects uniformity of a magnetic field, a temperature detecting unit that detects a temperature of a magnet or its surroundings, and a control unit that controls the shim coil based on the detected temperature. The control unit calculates an error component for changing the uniformity of the magnetic field at the detected temperature of the magnet or its surroundings, based on a temperature characteristic of uniformity of the magnetic field calculated in advance. Further, the control unit calculates a shim current that generates a correction magnetic field for canceling the error component, and drives the shim coil based on this shim current.

22 Claims, 11 Drawing Sheets

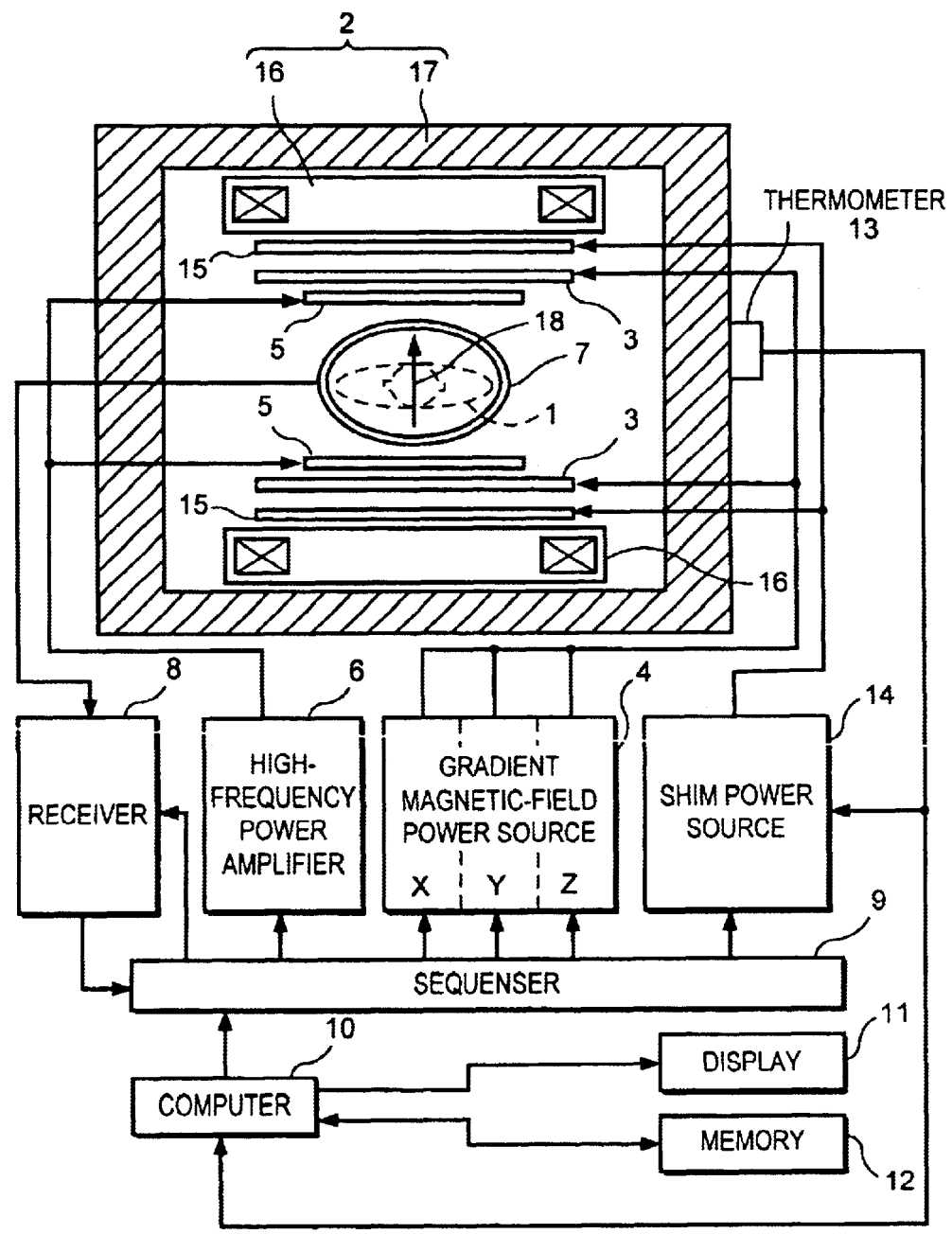
F I G. 1

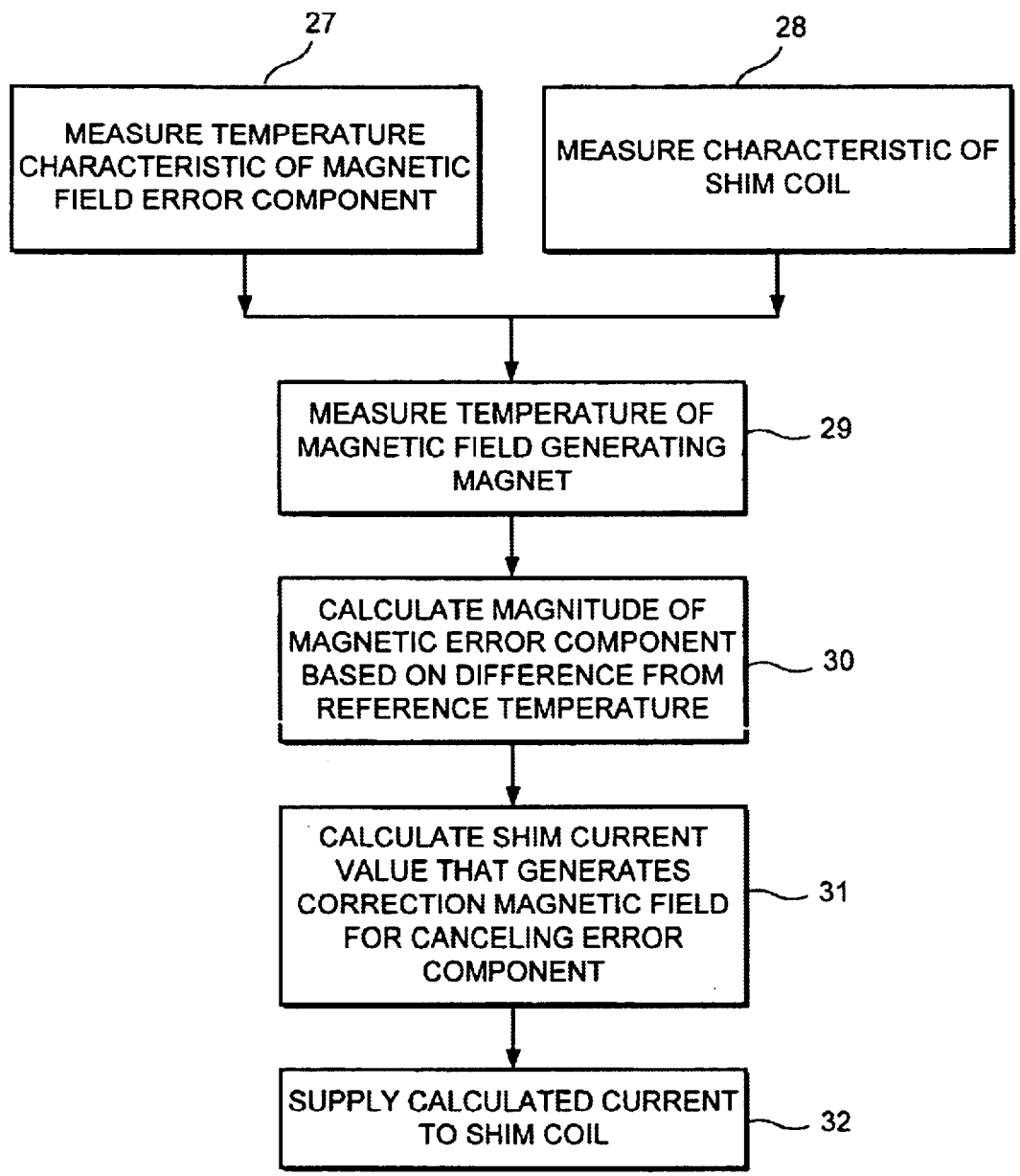
F I G. 2

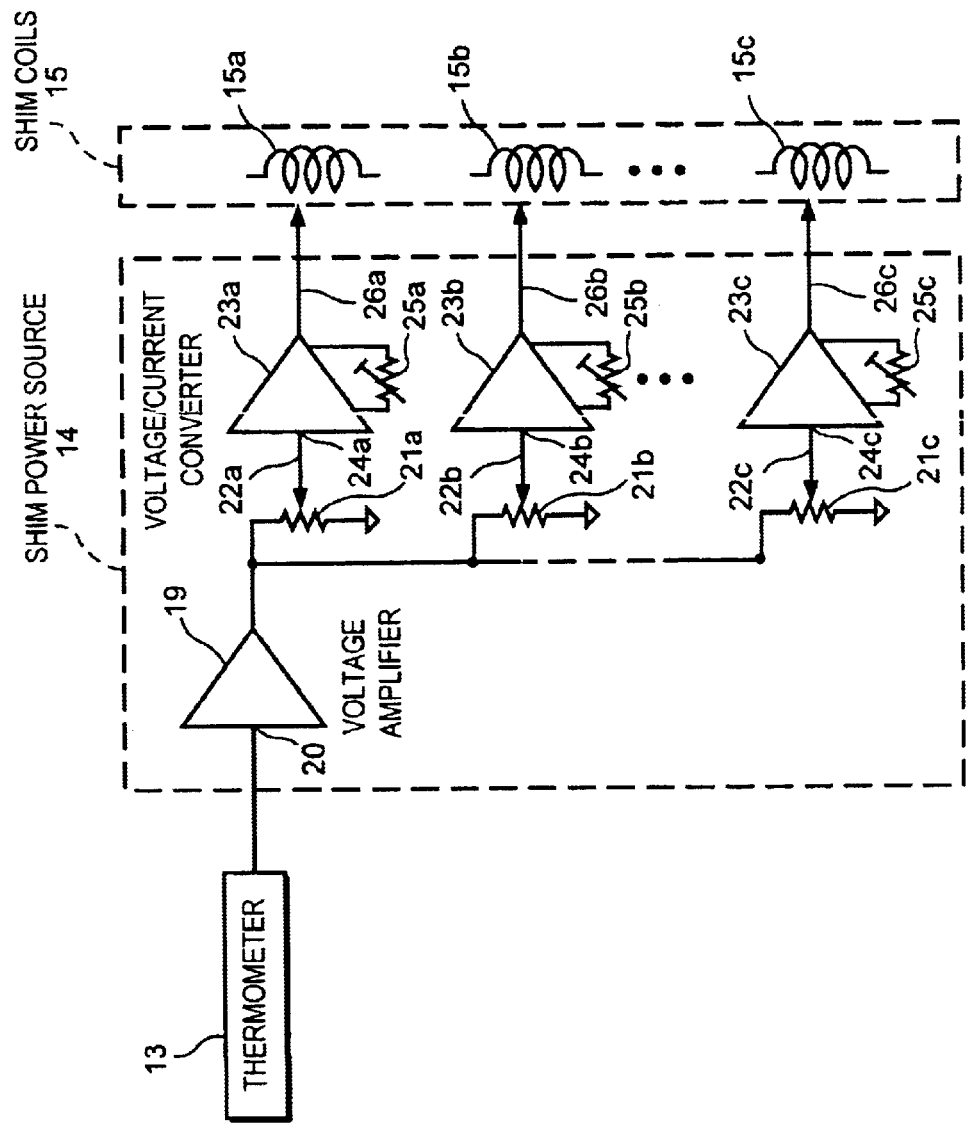
F I G. 5

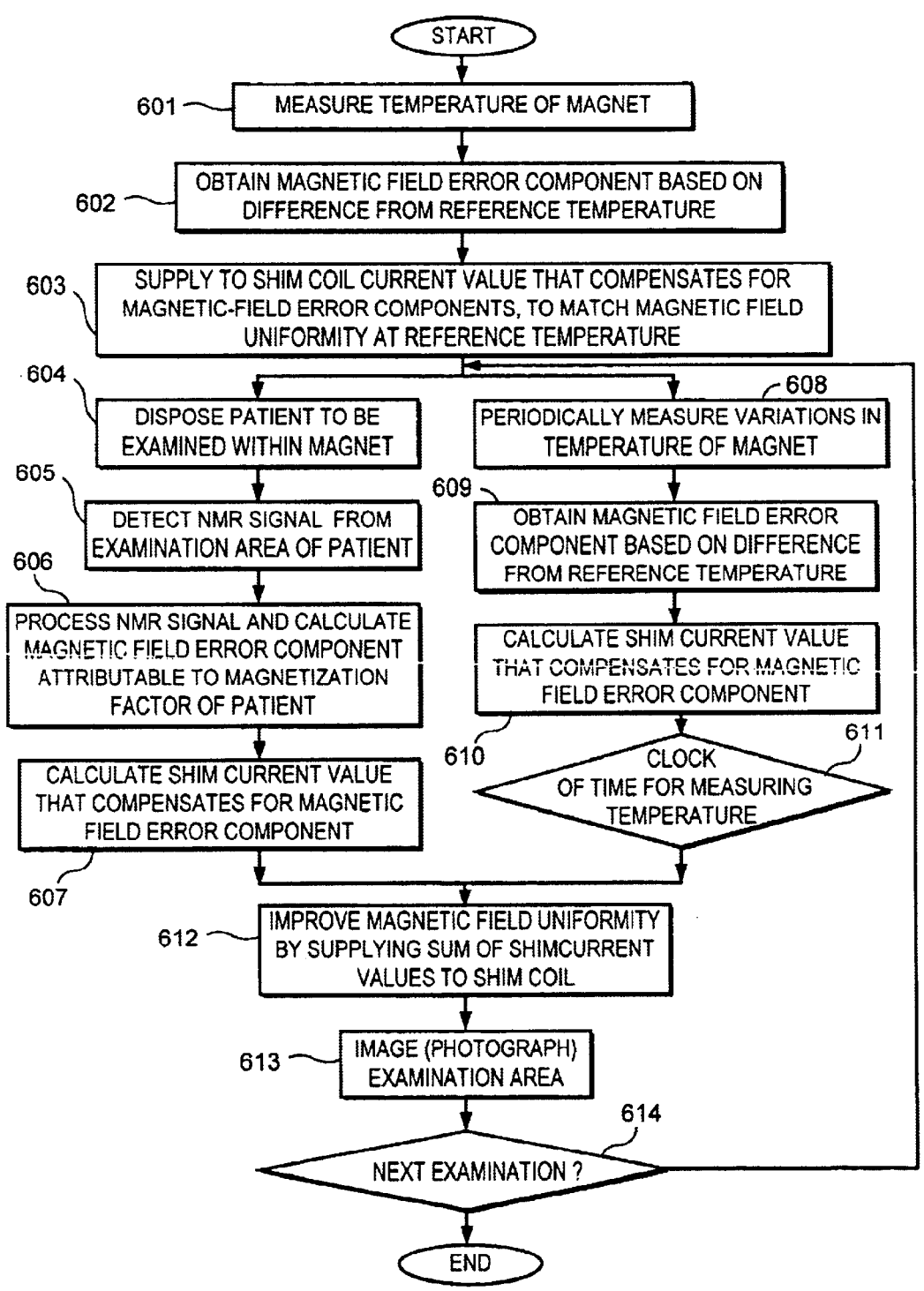
F I G. 6

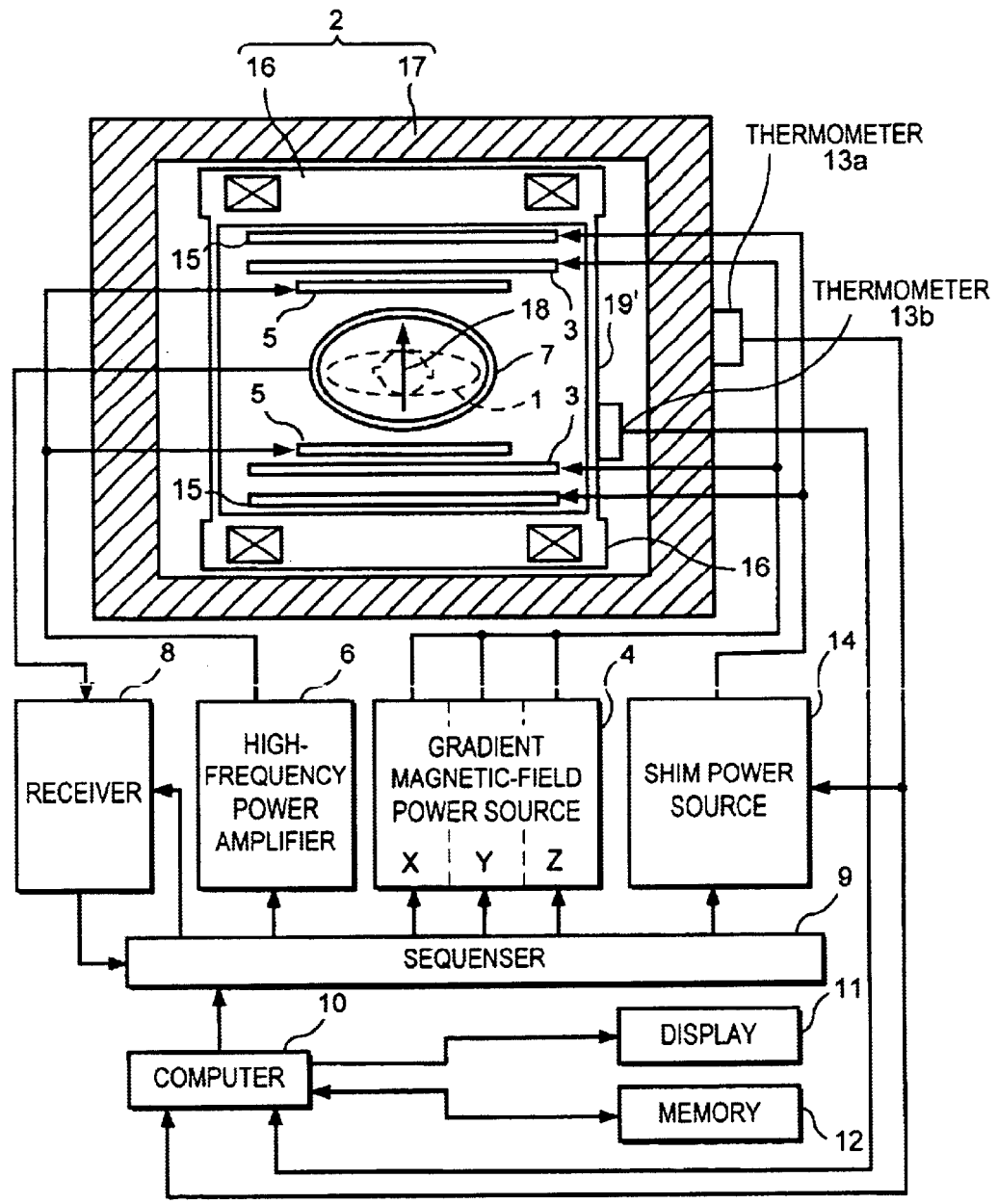
F I G. 7

MAGNETIC RESONANCE IMAGING APPARATUS AND METHOD FOR MAINTAINING HIGH UNIFORMITY OF MAGNETIC FIELD IN MAGNETIC RESONANCE IMAGING APPARATUS

BACKGROUND OF THE INVENTION

1. Field of the Invention

The present invention relates to a magnetic resonance imaging (hereinafter referred to as MRI) apparatus. Particularly, it relates to an MRI apparatus and a method suitable for obtaining a high-quality image by maintaining a magnetic field at a high homogeneous value.

2. Description of Related Art

In medical organizations, there is widely used MRI apparatuses that obtain a tomographic image of a human body by utilizing the nuclear magnetic resonance (NMR) phenomenon. Such apparatuses require a magnet that generates a magnetic field of uniform intensity in a space where the part of an object (e.g., a patient) to be examined is disposed in order to accurately image the internal structure of the part. Ideally, a uniform magnetic field space would be obtained within a solenoid coil of infinite length. Therefore, many of the magnets used in MRI apparatuses have slender cylindrical solenoid coils and shimming mechanisms that improve the uniformity of the magnetic fields.

In contrast to the MRI apparatus having a slender space for disposing a person (patient) to be examined, there has also been developed an MRI apparatus which employs a magnet structure with a short length or an open magnet structure having a wide opening. This MRI apparatus helps the patient feel more relaxed by relieving from the sense of confinement and makes it possible to apply an interventional method where the operator provides treatment during the examination using the MRI.

The magnet of short length or the magnet having the open structure uses an iron yoke to establish a magnetic circuit. The problem of this structure is that when the iron yoke thermally expands, the intensity and uniformity of the magnetic field change depending on the temperature.

In order to solve this problem, a method was developed for controlling the magnet to keep its temperature constant. One example of this technique is disclosed in Japanese Patent No. 2566410.

On the other hand, two shimming methods for improving the uniformity of the static magnetic field are available. One is a passive shimming that disposes a magnetic piece to cancel the non-uniformity of the static magnetic field. The other is active shimming that changes the current passed through a shim coil in response to uneven variation in the static magnetic field. One proposed active shimming ascertains the level of magnetic field non-uniformity by analyzing an NMR signal detected from the examined object, and controls the current passed through the shim coil based on this non-uniformity level. This is disclosed in, for example, U.S. Pat. No. 5,530,352.

The method of controlling the temperature of the magnet itself is an effective method in that it can generate a stable magnetic field regardless of the structure or shape of the magnet. However, this method has the following drawbacks.

(1) In order to keep the magnet at a constant temperature, the magnet temperature should be kept higher than the normal room temperature. For this purpose, the magnet needs to be surrounded by a high-temperature bath. This narrows the space for disposing the object to be examined.

(2) The magnet has large heat capacity and therefore takes a long time to reach a constant temperature. The temperature control circuit must therefore be operated for a considerable time before the magnet is used for an examination. In actual practice, the magnet is kept applied with current continuously. When a power failure occurs, the apparatus cannot be used until the magnet has recovered a stable temperature level.

(3) It is not possible to cope with a substantial or sudden change in the temperature around the magnet which exceeds the capacity and tracking speed of the magnet temperature control circuit.

Further, in new imaging methods which require high uniformity of the magnetic field (such as imaging in which only a fat signal is suppressed, or echo planar imaging EPI, etc.), it is necessary to control the temperature with higher precision and to maintain the uniformity of the magnetic field in a more stable condition than in earlier methods.

On the other hand, in the method of reducing the magnetic field non-uniformity by using an NMR signal from the examined object, it is necessary to adjust the uniformity of the magnetic field after the object has been disposed in the magnetic field. This lowers the efficiency of the MRI examination. Further, the non-uniformity of the magnetic field is different depending on the part of the patient to be examined and the disposed position of the patient. Therefore, this method involves complex adjustments, and is incapable of efficiently overcoming the non-uniformity due to temperature variations.

SUMMARY OF THE INVENTION

An object of the present invention is to provide an MRI apparatus and a method that can stably maintain the uniformity of the magnetic field without being affected by variations in temperature. Another object of the invention is to provide an MRI apparatus that can achieve high uniformity of the magnetic field and that can improve the quality of MRI examination data.

In order to achieve the above objects, according to one aspect of the present invention, there is provided an MRI apparatus which comprises: a static magnetic field generating unit that generates a static magnetic field of a constant magnetic field strength; a gradient magnetic field generating unit that generates a magnetic field strength gradient; a unit that generates a high-frequency magnetic field; a unit that detects a nuclear magnetic resonance signal generated from an object to be examined; and a unit that displays a result of the detection, wherein the MRI apparatus further includes a magnetic field correcting unit that generates an additional magnetic field for making uniform a space distribution of the static magnetic field; a unit that detects a temperature of the static magnetic field generating unit and/or surroundings thereof; and a unit that controls the magnetic field correcting unit based on the temperature detected by the temperature detecting unit.

According to the above aspect, the magnetic field correcting unit is controlled based on a detected temperature. The non-uniformity of the static magnetic field is corrected based on this control. Therefore, it is possible to eliminate non-uniformity of the magnetic field due to temperature variations with good response. Accordingly, it is possible to cope with substantial variations in temperature or sudden changes in temperature. It is also possible to eliminated the need for a high-temperature bath for keeping the static magnetic field generating unit at a constant temperature. Therefore, a large space for disposing the object to be examined can be secured. This makes it possible to improve the efficiency of interventional work.

According to the MRI apparatus of the present invention, the magnetic field correcting unit may include a shim coil and a unit that supplies a current to the shim coil. The control unit controls the current supplied to the shim coil, thereby improving the uniformity of the static magnetic field.

Preferably, the control unit controls the magnetic field correcting unit based on a temperature characteristic of the non-uniform component of the space distribution of the static magnetic field. The temperature characteristic of the non-uniform component can be ascertained in advance. The control unit calculates the non-uniform component at a detected temperature based on the detected temperature and the temperature characteristic, and controls the magnetic field correcting unit so as to generate an additional magnetic field that cancels the component.

Further, according to the MRI apparatus of the present invention, the temperature detecting unit may be disposed near the static magnetic field generating unit and/or in the room where the static magnetic field generating unit is disposed. For example, a thermometer disposed within the room can play the role of the temperature detecting unit. In this case, it is preferable for the thermometer to have a temperature setting unit that supplies the detected temperature to the control unit. The control unit controls the magnetic field correcting unit based on the temperature within the room set by the temperature setting unit. The temperature may be set by the temperature setting unit as a numerical value or a qualitative parameter.

Further, according to a preferred embodiment of the MRI apparatus of the present invention, the temperature detecting unit detects temperatures of at least two positions including the static magnetic field generating unit and/or its surroundings. The temperature characteristic of the non-uniform component of the space distribution of the static magnetic field is obtained in advance for each temperature change at each position. The control unit calculates the non-uniform component at the detected temperature from the temperature detected at each position and the temperature characteristic. The control unit then corrects the magnetic field correcting unit so as to generate an additional magnetic field that cancels total non-uniformity of the respective positions.

When a magnetic field is corrected based on temperatures detected in advance at a plurality of positions, it is possible to cope with a complex and uneven change in the temperature, such as, for example, a local temperature change attributable to an eddy or substantial temperature variations around this position.

According to another embodiment of the MRI apparatus of the present invention, the magnetic field correcting unit generates at least one additional magnetic field of y linear term, z quadratic term and z quartic term, where z is the direction of the static magnetic field and y is a direction orthogonal thereto. The control unit corrects the magnetic field for at least one of the y linear term, z quadratic term and z quartic term based the detected temperature.

According to another aspect of the present invention, there is provided a method for maintaining uniformity of a static magnetic field, which is a method of maintaining uniformity of a static magnetic field generated by a static magnetic field generating unit in an MRI apparatus, by generating an additional magnetic field. This method includes the steps of: obtaining a temperature dependence of a non-uniform component of a space distribution of a static magnetic field; detecting a temperature of the static magnetic field generating unit; and obtaining an intensity of the additional magnetic field based on the detected temperature and the temperature dependence.

According to the method for maintaining uniformity of a static magnetic field, the steps from the temperature detection to the generation of the additional magnetic field may be operated at all times, or may be operated as required or periodically.

The method for maintaining uniformity of a static magnetic field may be performed together with active shimming that corrects error of magnetic field due to a magnetization of the object to be examined. Such a method for maintaining uniformity of a static magnetic field according to the present invention further comprises the steps of: measuring NMR signals generated from an object to be examined; calculating a magnetic field error component attributable to the object using the measured NMR signals; calculating a strength of the additional magnetic field based on the error component attributable to the object; and generating an additional magnetic field having an intensity equal to that of the sum of that obtained based on the detected temperature and the temperature dependence and that calculated based on the error component.

BRIEF DESCRIPTION OF THE DRAWINGS

FIG. 1 is a schematic view of the overall structure of an MRI apparatus according to one embodiment of the present invention.

FIG. 2 is a flowchart showing one embodiment of a method for maintaining uniformity of a magnetic field according to the present invention.

FIG. 5 is a diagram showing details of a magnetic field correcting system of the MRI apparatus shown in FIG. 1.

FIG. 6 is a flowchart showing another embodiment of a method for maintaining uniformity of a magnetic field according to the present invention.

FIG. 7 is a schematic view of the overall structure of an MRI apparatus according to a second embodiment of the present invention.

DETAILED DESCRIPTION OF THE PREFERRED EMBODIMENTS

Figure 3:
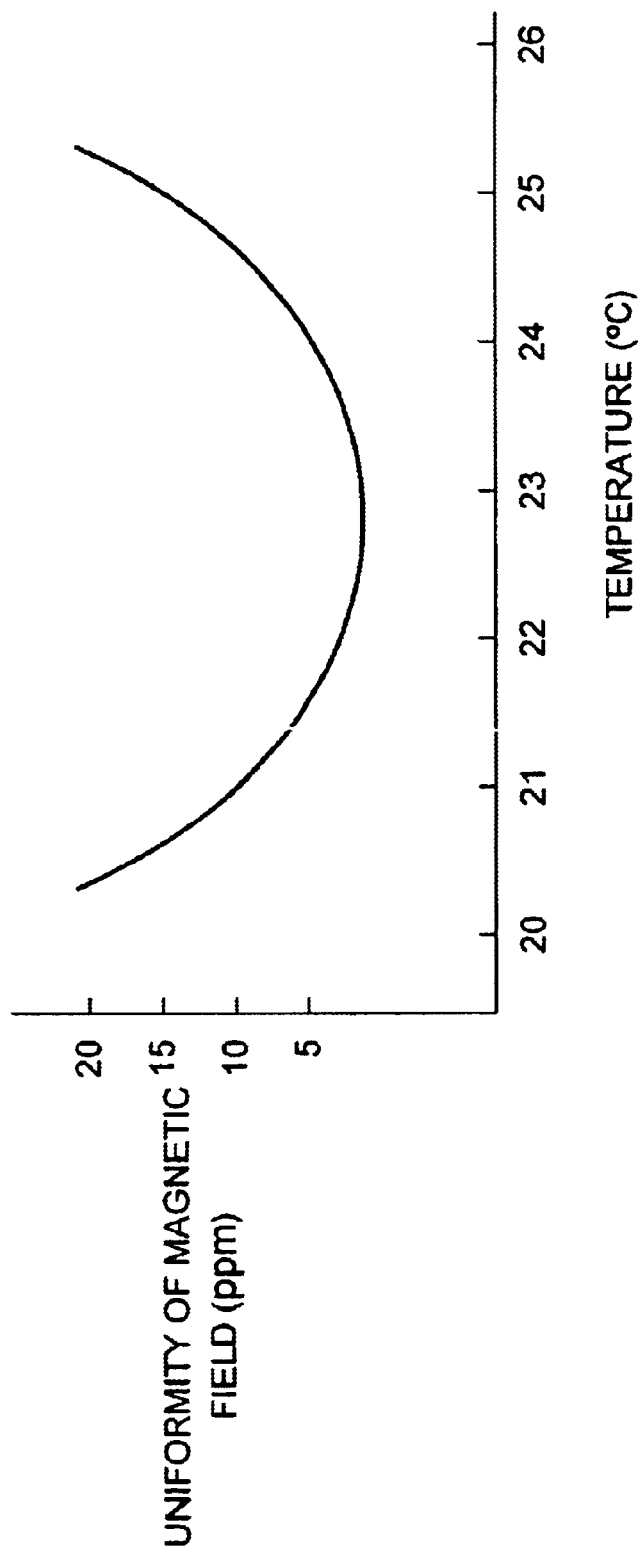
FIG. 3 is a graph showing a temperature characteristic of uniformity of a magnetic field of a static magnetic field generating magnet.

Preferred embodiments of the present invention will be explained hereinafter with reference to the drawings.

FIG. 1 is a diagram showing the overall structure of an MRI apparatus according to one embodiment of the present invention. This MRI apparatus includes a static magnetic field generating magnet 2 disposed to sandwich a space in which an object to be examined (e.g., a patient) is placed, gradient magnetic field coils 3 disposed inside the static magnetic field generating magnet 2, high-frequency coils 5 disposed inside the static magnetic field generating magnet 2, and a detecting coil 7 for detecting an NMR signal generated from the object to be examined 1. The MRI apparatus further comprises a sequencer 9 that controls the operation timing of each coil, and a computer 10 that controls the apparatus and processes NMR signals to form an image based on the signals.

The static magnetic field generating magnet 2 consists of a pair of superconducting coils 16 facing each other in the drawing, and an iron yoke 17 that forms a magnetic circuit to surround the superconducting coils 16. The static magnetic field generating unit 2 generates a uniform static magnetic field around the object 1 in a direction orthogonal to a body axis of the object 1. This magnetic field has an intensity, or magnetic flux density, of 0.5 tesla, for example. The direction of the magnetic flux is from the floor to the ceiling as shown by an arrow 18. The uniformity of the magnetic field is adjusted to become approximately 5 ppm or lower in a spherical space having a diameter of 40 cm in which the object 1 is disposed. For adjusting the uniformity of the magnetic field, the passive shimming method is employed, which adheres a plurality of small magnetic pieces (not shown) onto the surface of each superconducting coil 16.

The gradient magnetic field coils 3 are three sets of gradient magnetic field coils 3 wound so as to change the magnetic flux density in three axial directions x, y and z that are orthogonal with each other. These gradient magnetic field coils 3 are connected to a gradient magnetic field power source 4. The coils and power source constitute a gradient magnetic field generating unit. According to a control signal sent from the sequencer 9, to be described later, the gradient magnetic field power source 4 is driven to change the values of currents that flow through the gradient magnetic field coils 3. As a result, the gradient magnetic field coils 3 apply gradient magnetic fields Gx, Gy and Gz to the object 1. These gradient magnetic fields are used to obtain a spatial distribution of the NMR signal obtained from an examined part of the object 1 to be examined.

The high-frequency coils 5 are connected to a high-frequency power amplifier 6 that supplies a high-frequency current to the high-frequency coils 5, and generate a high-frequency magnetic field for exciting the resonance of atomic nuclei (usually, hydrogen atomic nuclei) of the examined part of the object. The high-frequency power amplifier 6 is controlled by the control signal of the sequencer 9.

The detecting coil 7 is connected to a receiver 8 to constitute a unit that detects the NMR signals. The receiver 8 amplifies and detects the NMR signals detected by the detecting coil 7, and converts these signals into digital signals that can be processed by the computer 10. The sequencer 9 also controls the operation timing of the receiver 8.

The computer 10 performs reconstruction of image and calculation of spectrum by using the NMR signals converted into the digital signals. At the same time, the computer 10 controls the operation of each unit of the MRI apparatus at predetermined timing through the sequencer 9. The computer 10, a memory unit 12 that stores data, and a display unit 11 that displays the processed data constitute an operating and processing system.

In addition to the above units, the MRI apparatus is provided with a magnetic field correcting system that maintains the uniformity of the magnetic field generated by the static magnetic field generating magnet 2. The magnetic field correcting system consists of a thermometer 13 that detects temperature and outputs an electric signal corresponding to the detected temperature, a shim power source 14 that changes its output current based on the output signal value of the thermometer 13, and a shim coil 15 that generates a correction magnetic field (additional magnetic field) when the output current from the shim power source 14 is applied to the shim coil 15.

In the embodiment shown in FIG. 1, the thermometer 13 is disposed on the iron yoke 17 of the static magnetic field generating magnet 2, and detects the temperature of the iron yoke. The shim coil 15 consists of one or a plurality of coils such as a coil that generates a magnetic field of a z term and a coil that generates magnetic field of xy term corresponding to a non-uniform component of the static magnetic field. Each shim coil 15 is disposed between the superconducting coils 16 and the gradient magnetic field coils 3. The gradient magnetic field coils 3 may also work as shim coils that generate a linear term correction magnetic field.

A method for maintaining the uniformity of the static magnetic field in the MRI apparatus of the above construction will be explained next based on the flowchart shown in FIG. 2.

At first, a relationship between temperature and the non-uniformity of the magnetic field, that is, the temperature characteristic of the non-uniformity of the magnetic field is measured in advance. For measuring the temperature characteristic of the non-uniformity of the magnetic field, the magnitude of the non-uniformity (error magnitude) generated by change in temperature is measured for each component of each shim coil (step 27).

As explained earlier, the static magnetic field generating magnet 2 is adjusted by the passive shim method by using small magnetic pieces. The static magnetic field generating magnet 2 has the highest uniformity of the magnetic field at 23° C., for example, and the uniformity is 5 ppm or lower in the space in which the object 1 is disposed (that is the spherical space of a diameter 40 cm), as shown in FIG. 3. As the temperature of the static magnetic field generating magnet 2 (particularly, the iron yoke 17) changes from 23° C., the uniformity of the magnetic field decreases from 5 ppm. This is caused by a slight distortion in the structure of the magnet by thermal expansion of the iron yoke that constitutes the magnetic circuit.

Figure 4:
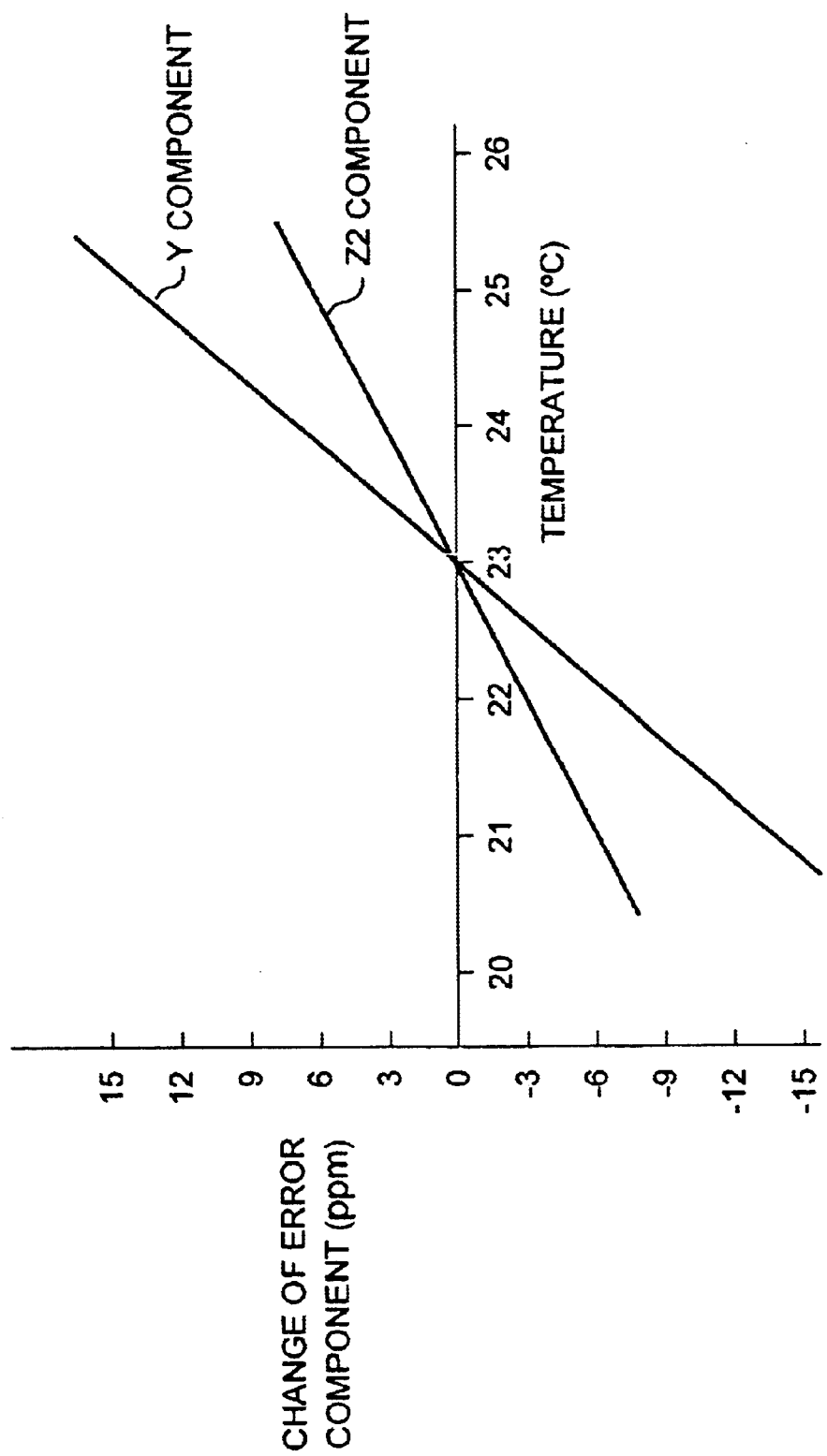
FIG. 4 is a graph showing temperature characteristics of error components y and $z^2$.

Such non-uniformity of the magnetic field is the sum of the non-uniformity of each component such as a linear term component of y (hereinafter to be referred to as y component) and a quadratic term component of z (hereinafter to be referred to as $z^2$ component). In the case of the y component, for example, the uniformity changes by approximately 6 ppm for a temperature change of 1° C., as shown in FIG. 4. The uniformity changes by approximately 3 ppm in the case of the e component. At step 27, temperature characteristic is obtained for each non-uniformity component of the magnetic field (hereinafter to be referred to as error component) in advance.

In the meantime, a shim characteristic is obtained for each shim coil in advance (step 28). The shim characteristic is the intensity of the magnetic field generated by the shim coil when a unit current is passed through the shim coil. When the shim characteristic is obtained in advance, it is possible to obtain a current value necessary for generating a desired magnetic field intensity. In the MRI apparatus shown in FIG. 1, the shim coil of the $z^2$ component, for example, is manufactured to have a size and a coil winding that can generate a magnetic field of the $z^2$ component by 5 ppm in the spherical space of a diameter 40 cm, when a current of 1 ampere is applied to this shim coil.

Next, the temperature of the static magnetic field generating magnet 2 is measured (step 29). Based on the temperature difference between this measured temperature and a reference temperature (the temperature at which the uniformity of the static magnetic field becomes best, for example, 23° C.), a change in the error component is calculated for each magnetic field component (step 30). This change of the error component can be found using the temperature characteristic (FIG. 4) of each error component obtained in advance.

Then, a shim current that generates a correction magnetic field for canceling the change of the error component is calculated for each shim coil. This current is supplied to the shim coil (steps 31, 32). In the example shown in FIG. 4, when the temperature difference is +1° C., the change of the error component of the $z^2$ component is 3 ppm. Therefore, when the shim current that generates —3 ppm (⅗ ampere in the above example) is applied to the shim coil of the $z^2$ component (shim characteristic 5 ppm/A), it is possible to cancel the non-uniformity of the static magnetic field attributable to the temperature variations.

As explained above, by finding the shim current based on the detected temperature for each of the plurality of shim coils and then applying this current, the uniformity of the magnetic field of the static magnetic field generating magnet 2 can be maintained at the optimum 5 ppm or a lower value regardless of variations in the temperature of the static magnetic field generating magnet 2.

The above steps 29 to 31 shown in FIG. 2 may be conducted at all times, or may be conducted for a predetermined period of time for each examination. Alternatively, the steps may be conducted only when the temperature variation exceeds a predetermined temperature range.

The above-described control of the shim coils (steps 29 to 31) may be carried out by, for example, a program installed in a computer incorporated in the shim power source 14 or the computer 10 of the MRI apparatus. Alternatively, the shim coils may be controlled by an analog circuit.

FIG. 5 shows an embodiment of the shim power source 14 constructed as an analog control circuit. The shim power source 14 includes a voltage amplifier 19 that receives an output voltage from the thermometer 13, a plurality of variable resistors 22a, 22b and 22c that correspond to the plurality of shim coils 15a, 15b and 15c respectively, and voltage/current converters 23a, 23b and 23c. The output voltage v of a thermometer 13 is applied to an input terminal 20 of the voltage amplifier 19 of the shim power source 14.

The output voltage of the thermometer 13 is arranged such that a predetermined output voltage v is generated at a reference temperature (for example, 23° C.) as a temperature indicated value, and each time the temperature increase by 1° C., the terminal voltage increases by a predetermined quantity of Δv. The output voltage v of the thermometer 13 is input to the voltage amplifier 19.

The voltage amplifier 19 is provided with an offset adjustment of −v volt so that the voltage of (input voltage minus v) is amplified by n times, and the output voltage of the voltage amplifier 19 is applied to one end of each of the variable resistors 21a to 21c. Namely, the voltage amplifier 19 generates nΔv volt each time the temperature increases by 1° C.

The other ends of the variable resistors 21a to 21c are grounded and have voltage of 0. Therefore, it is possible to select any optional value from 0 to nV for the voltages of the variable terminals 22a to 22c, by adjusting the corresponding variable resistors 21a to 21c. Voltages of the variable terminals 22a to 22c are applied to input terminals 24a to 24c of the voltage/current converters 23a to 23c. Adjustment resistors 25a to 25c for adding constant offset currents to the output currents of the voltage/current converters 23a to 23c are added to these voltage/current converters 23a to 23c respectively. Output terminals 26a to 26c of the voltage/current converters 23a to 23c are connected to the shim coils 15a to 15c that generate correction magnetic field components so that currents from these output terminals 26a to 26c are applied to the respective shim coils.

The shim coil characteristic of the shim coil 15a is assumed as follows. The change in the magnetic field when a unit current is passed through the shim coil is $\epsilon 0$ (ppm/A), and the change in the magnetic field per +1° C. of the error component corresponding to the shim coil 15a is $\epsilon 1$ (ppm/° C.). Then, the current I [A/° C.] necessary to cancel the change in the magnetic field generated by the temperature change of +1° C. is I=$\epsilon 1/\epsilon 0$. On the other hand, a current I' supplied to the shim coil 15a based on an output nΔ[V/° C.] of the voltage amplifier 19 that has detected a temperature change of +1° C. becomes I'=nΔv·x·c when the ratio of the output voltage to the input voltage of the variable resistor 21a is expressed as x, and the conversion factor of the voltage/current converter 23a is c[A/V]. Therefore, in order to make I=I', the variable resistor 21a is adjusted so that the ratio (x) of the output voltage to the input voltage satisfies the following equation (1).

$$n\Delta v \cdot x \cdot c = \epsilon 1/\epsilon 0$$

$$x = \epsilon 1/(\epsilon 0 \cdot c \cdot n \Delta v) \qquad (1)$$

Thus, it becomes possible to automatically correct the magnetic field in response to the temperature change.

It is assumed, for example, that the output voltage of the thermometer 13 is set to 0.5 volt at the reference temperature, and the inter-terminal voltage increases by 0.2 volt when the temperature increases by 1° C. If the voltage amplifier 19 has an amplification factor of five, 1 (0.2×5) volt is output per 1° C. increase, since the offset voltage of −0.5 volt is set.

On the other hand, the correction magnetic field of the $z^2$ component requires 3 ($\epsilon 1$) ppm for a temperature change of 1° C. of the static magnetic field generating magnet 2. When the shim characteristic $\epsilon 0$ of the shim coil 15a of the $z^2$ component is 5 ppm/A, it is necessary to apply a current of 0.6 ampere in order to generate this 3 ppm by the shim coil 15a of the $z^2$ component.

It is assumed that the voltage/current converter 23a converts an input signal of 1 volt to an output signal of 1 ampere, that is, the conversion factor c is 1. When the variable terminal 22a of the variable resistor 21a is adjusted to a position of 60% (x=0.6), the voltage/current converter 23a can generate a current of 0.6° C. ampere and can supply the current necessary for generating the DJ correction magnetic field of 3 ppm to the shim coil 15a.

By adjusting the variable resistor 21a in advance as explained above, it is possible to generate the correction magnetic field component of the $z^2$ to match the temperature change of the static magnetic field generating magnet 2. In other words, in the above example, the 3 ppm of the error component of the $z^2$ per temperature change of 1° C. coincides in absolute value with the −3 ppm of the correction magnetic field of the shim coil 15a. With this arrangement, the uniformity of the magnetic field can be maintained at 5 ppm without being affected by temperature variations.

The maintenance of the uniformity of the magnetic field has been explained with regard to the shim coil 15a as one example. For the y component and other components, it is also possible to carry out a similar adjustment of the variable resistor 21 based on the equation (1) when the shim characteristic $\epsilon 0$ and the temperature characteristic $\epsilon 1$ of the component are known in advance. Thus, it is possible to maintain high uniformity of the magnetic field for all the components. When the shim coil that corrects the y component also works as the gradient magnetic field coil of the y axis, the shim current is superimposed on the gradient magnetic field current that is applied to the gradient magnetic field coil of the y axis at the time of imaging.

According to the above method for maintaining the uniformity of the magnetic field, it is possible to correct with priority the error component of a magnetic field that has a large variation along with the variation in the temperature. Therefore, it is possible to efficiently maintain the uniformity of the magnetic field. Further, since the ratio of the temperature change of the error component is found and the correction is performed based on the ratio, it is possible to accurately correct the error component. Further, it is easy to structure in a control loop the process from the occurrence of a temperature change to the generation of the correction magnetic field. Therefore, a complex operation can be automated. It is also possible to operate the correction function at all times.

In the embodiment shown in FIG. 1, the temperature is measured by using the thermometer 13 installed on the iron yoke 17 of the static magnetic field generating magnet 2. However, the thermometer 13 may instead be installed near the static magnetic field generating magnet 2. It is also possible to use a room thermometer installed in the room in which the static magnetic field generating magnet 2 is disposed. In this case, it is necessary to provide a temperature setting unit to supply an electric signal corresponding to the detected temperature to the control circuit (shim power source 14) of the shim coil. The temperature setting unit may be integrally provided in the console section of the MRI apparatus, or may be attached to the shim power source 14.

The temperature setting unit can replace the thermometer 13 in the control circuit shown in FIG. 5 to transmit an electric signal corresponding to a set temperature to the voltage amplifier 19. The shim current is obtained from the power source 14 based on the temperature set by the temperature setting unit, and then, the power source supplies this shim current to the shim coil in a similar manner to that of the above embodiment. Thus, similar effects to those of the above embodiment can be obtained. However, in this case, it is necessary to take into consideration the time delay of the temperature change of the static magnetic field generating magnet that occurs after the change in the room temperature. The room temperature may be input directly to the temperature setting unit as a numerical value. Alternatively, as the room temperature of the measuring room is kept within the range of +5° C., it may be set by means of the temperature level such as "high-medium-low".

In the above embodiment, only the case of correcting the non-uniformity component of the magnetic field due to the temperature variations of the magnet has been explained. However, it may be performed together with the conventional active shimming method. The active shimming may be a method that detects NMR signals of the part of the object to be examined, analyzes the detected NoM signal, and applies a correction current to the shim coil to improve the uniformity of the magnetic field. Such an embodiment will be explained hereinafter with reference to FIG. 6.

In this embodiment, non-uniformity of the magnetic field due to temperature variations is corrected prior to the examination by the MRI apparatus (601–603). The temperature characteristic of each error component and shim characteristic of each shim coil are obtained in advance in a similar manner to that shown in FIG. 2. Before the examination, the temperature of the magnet is measured (601). The difference between the temperature at which the magnet achieves optimum uniformity of the magnetic field (reference temperature, for example 23° C.) and the measured temperature is obtained. The magnitude of the error component of the magnetic field is calculated from the temperature characteristic of the error component obtained in advance (602). Next, a shin current that generates a correction magnetic field for compensating for the magnetic field error component is obtained, and this current is applied to the shim coil (603). At this stage, the thus obtained uniformity of the magnetic field is similar to the uniformity at the reference temperature.

Next, the uniformity of the magnetic field is further 6i corrected with the object to be examined (patient) disposed within the apparatus (604–607). At first, the object is disposed so that the area of the patient to be examined is positioned at almost the center of the magnet (604). A high-frequency pulse(s) is applied to the area, and an NMR signal(s) is detected from the area (605). This NMR signal(s) is processed to calculate the error component of the magnetic field (606). This error component of the magnetic field is generated because the uniformity of the magnetic field was disturbed by a magnetization factor of the examination area of the patient and can be calculated, for example, by calculating the phase difference of the NMR signal. One example of a method of calculation the magnetic field error component from the phase difference of the NMR signal is described in "A method of calculating distribution of static magnetic field intensity in NMR examination apparatus" in Japanese Patent Publication No. 1849055 (Japanese Patent Application Laid-open No. 5-56140, U.S. Pat. No. 4,672, 318). Then a shim current that generates a correction magnetic field for compensating for this error component is calculated (607).

In parallel with the above steps 604 to 607, the magnetic field change due to the temperature variation of the magnet is corrected periodically (608–611). These steps 608 to 611 are similar to the correction steps 601 to 603 carried out prior to the examination. Passage of a predetermined time period is clocked (611) and the magnetic field is corrected only when the predetermined time period has passed. This time period is determined by taking into account the change factor of the ambient temperature and the temperature time constant of the magnet.

The shim current obtained at step 610 is superimposed on the shim current obtained at step 607, and the result is supplied to the shim coil (612). Thus, the error component due to the influence of the magnetization factor of the object and the error component of the magnetic field due to temperature variation of the magnet are corrected. It is thus possible to achieve a high-level uniformity of the magnetic field. The examination of the patient is started in this state (613). The next examination is then conducted if necessary (614).

According to this embodiment, it is possible to correct not only the non-uniformity of the magnetic field due to temperature variation of the magnet, but also the non-uniformity of the magnetic field due to the influence of the magnetization factor of the examination area of the patient. Therefore, an MRI apparatus that achieves high uniformity of magnetic field can be provided. Using the MRI apparatus a high-quality image can be obtained even when the imaging method requires high uniformity of the magnetic field, such as imaging in which only a fat signal is suppressed or an EPI.

A second embodiment of the present invention will be explained hereinafter.

FIG. 7 is a diagram showing the overall structure of an MRI apparatus to which a second embodiment is applied. The structure of this MRI apparatus is substantially similar to that of the MRI apparatus shown in FIG. 1. The same reference numerals are given to parts corresponding to the parts shown in FIG. 1. This MRI apparatus has a thermometer 13a on an iron yoke 17 of a static magnetic field generating magnet 2, as in the MRI apparatus shown in FIG. 1. In addition, this MRI has a thermometer 13b as a second temperature-detecting unit at a connection pipe 19' that connects between liquid helium baths of a pair of superconducting coils 16.

These thermometers 13a and 13b detect the temperatures of the iron yoke 17 and the connection pipe 19', and output electric signals corresponding to the detected temperatures. The output signals from the thermometers 13a and 13b are input to a shim power source 14. The shim power source 14 changes its output current based on these output signals. A shim coil 15 generates a correction magnetic filed (additional magnetic field) based on the output current from the shim power source 14.

The shim coil 15 consists of one or a plurality of coils including a coil that generates a magnetic field of the $Z^2$ term and a coil that generates a magnetic field of the $z^4$ term. In the present embodiment, a gradient magnetic field coil 3 may also function as the shim coil that generates a compensation magnetic field of a linear term.

In the thus constructed MRI apparatus, the process of maintaining the uniformity of the static magnetic field is similar to that shown in FIG. 2. First, the temperature characteristic of the magnetic field error component is measured (step 27), and the shim characteristic of the shim coil is measured (step 28). At step 27, when measuring the temperature characteristic of the magnetic field error component, the relationship between the temperature of an iron yoke 17 (static magnetic field generating magnet) and the magnetic field non-uniformity and the relationship between the difference of temperature between the iron yoke 17 and the connection pipe 19' and the magnetic field non-uniformity are obtained respectively in advance.

Namely, for the temperature of the iron yoke 17, the non-uniformity (error) generated due to temperature variation is measured for each component corresponding to the shim coil. Similarly, for variation in the temperature difference between the iron yoke 17 and the connection pipe 19', the non-uniformity (error) generated due to temperature variation is measured for each component corresponding to the component of the shim coil.

Figure 8:
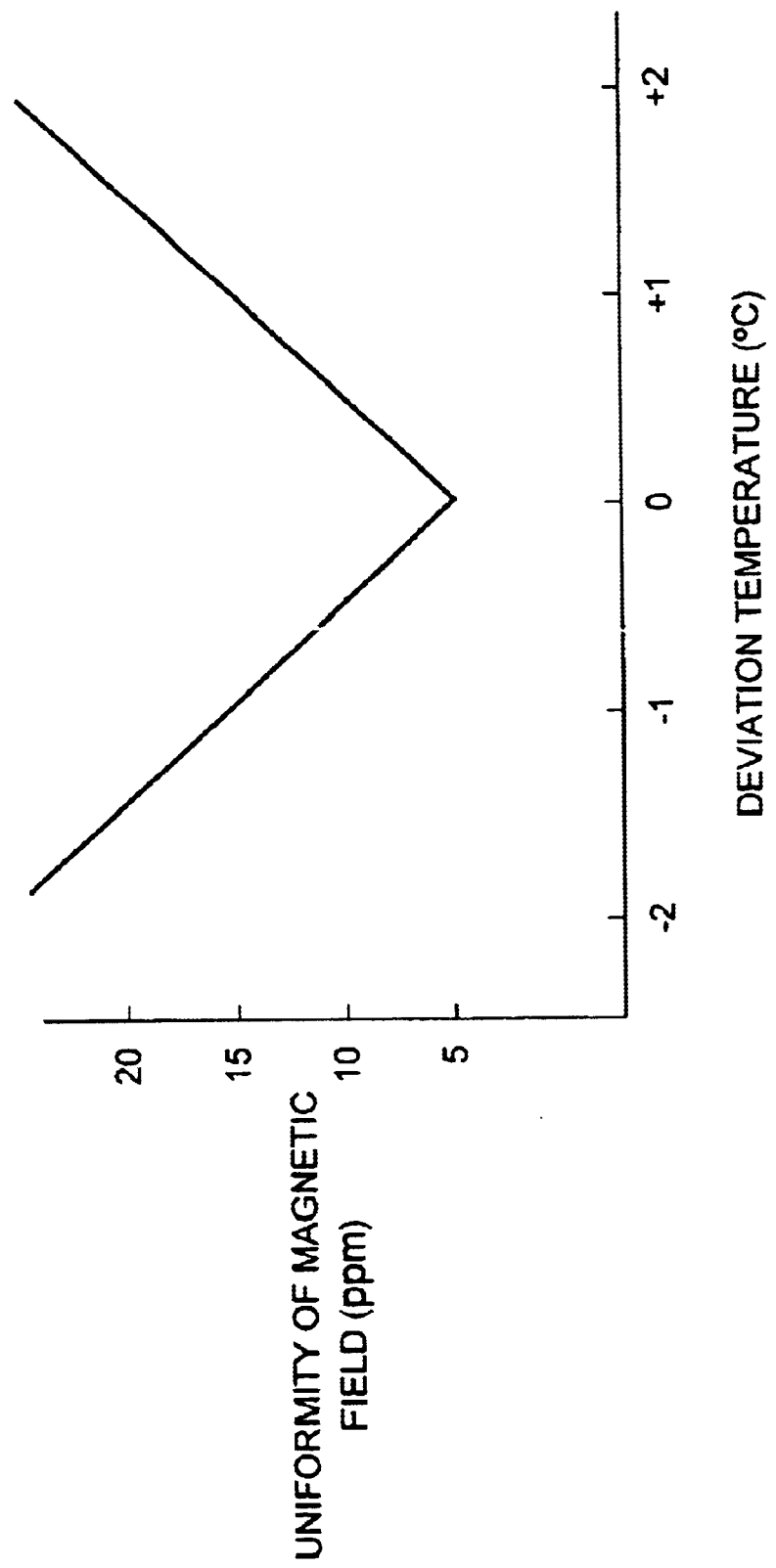
FIG. 8 is a graph showing a temperature characteristic of a magnetic field of a static magnetic field generating magnet for a temperature difference between an iron yoke and a connection pipe for connecting a superconducting coil.

The temperature variation of the iron yoke (that is, temperature variation of the static magnetic field generating magnet) is as follows. As shown in FIG. 3, the magnetic uniformity is the highest at 23° C. When the temperature changes from 23° C., the magnetic field uniformity deteriorates gradually. On the other hand, when there is a temperature difference between the iron yoke 17 and the connection pipe 19', the structure of the magnet is distorted in a complex manner but to a minor degree. The magnetic field uniformity deteriorates because of the difference in thermal expansion between the iron yoke 17 and the connection pipe 19'. FIG. 8 schematically illustrates this state. As shown in FIG. 8, when the temperature difference between the iron yoke 17 and the connection pipe 19' is zero, the magnetic field uniformity is 5 ppm or lower. As the temperature difference occurs and when it becomes larger, the magnetic field uniformity deteriorates linearly.

Figure 9:
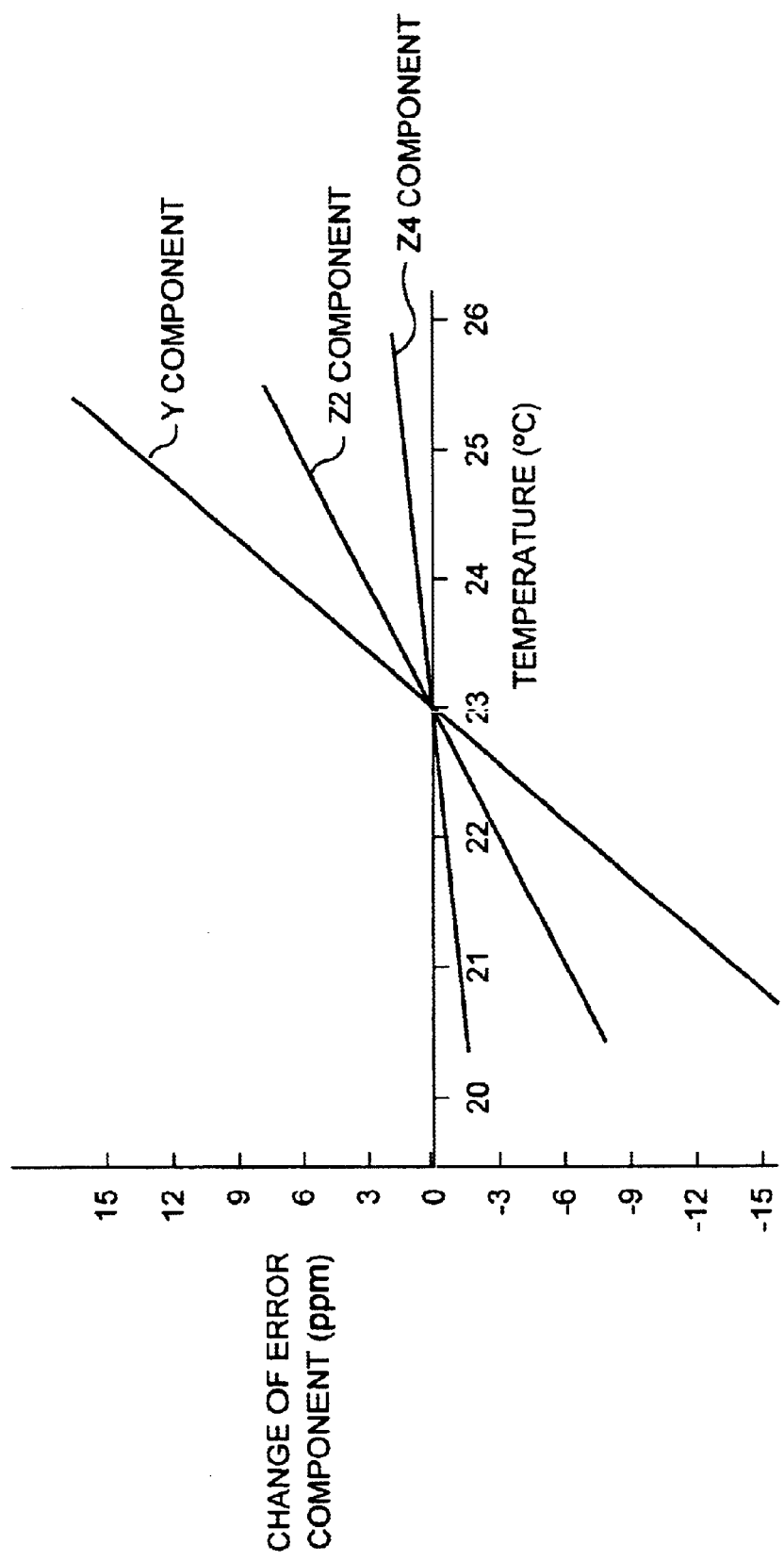
FIG. 9 is a graph showing temperature characteristics of error components y, $z^2$ and $z^4$.
Figure 10:
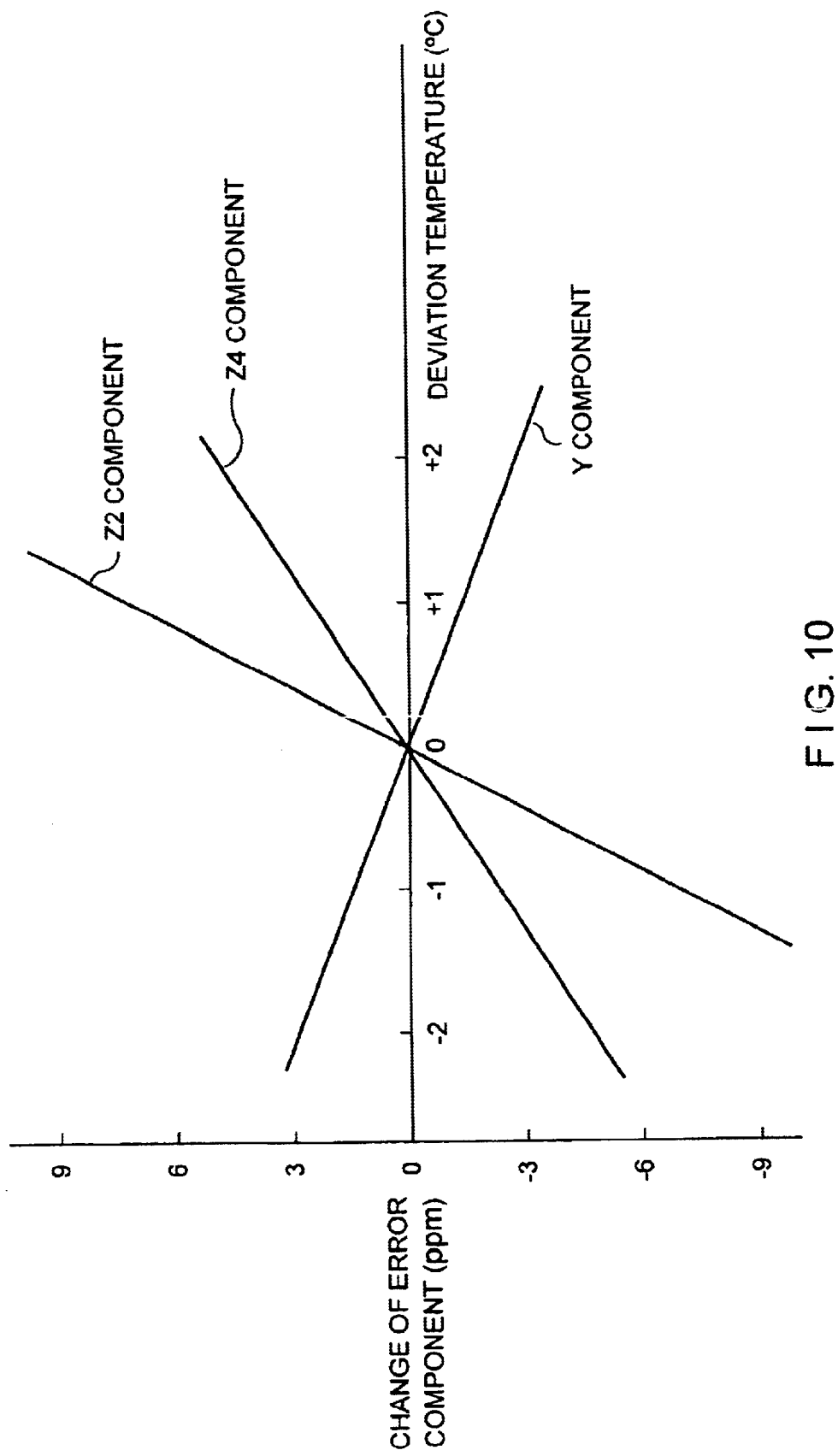
FIG. 10 is a graph showing temperature characteristics of error components y, $Z^2$ and $z^4$.

The non-uniformity of the magnetic field attributable to the temperature variation is obtained as the sum of the following three factors: the non-uniformity of the linear term component of y (hereinafter referred to as y component), the quadratic term component of z (hereinafter referred to as $z^2$ component) and the quartic term component of z (hereinafter referred to as $z^4$ component). As shown in FIG. 9, when the temperature of the whole static magnetic field generating magnet 2 changes by 1° C., for example, the y component changes by approximately 6 ppm, the $z^2$ component changes by approximately 3 ppm, and the $z^4$ component changes by approximately 0.5 ppm. On the other hand, as shown in FIG. 10, when the temperature difference between the iron yoke 17 and the connection pipe 19' changes, the y component changes by approximately −1.5 ppm, the $z^2$ component changes by approximately 6 ppm, and the $z^4$ component changes by approximately 3 ppm. As explained above, at step 27, the temperature characteristic of each non-uniformity component of the magnetic field (hereinafter referred to as an error component) is obtained in advance.

At step 28, the shim characteristic is obtained for each shim coil. Next, the temperatures of the iron yoke 17 of the static magnetic field generating magnet 2 and the connection pipe 19' are measured (step 29). The error component change is obtained for each component based on the two characteristics, i.e., the temperature difference between the measured temperature and a reference temperature (the temperature at which the static magnetic field uniformity becomes optimum, for example, 23° C.), and the temperature difference between the iron yoke 17 and the connection pipe 19' (step 30). The error component change can be obtained by using the temperature characteristic of each error component obtained in advance (FIG. 9 and FIG. 10).

The shim current that generates a correction magnetic field for canceling the change of the error component is calculated for each shim coil. This current is then supplied to the shim coil (steps 31, 32). In the examples shown in FIG. 9 and FIG. 10, it is assumed that the temperature of the whole static magnetic field generating magnet 2 has increased by +1° C. from the reference temperature 23° C., and the temperature difference between the iron yoke 17 and the connection pipe 19' is zero. In this case, the error component change of the $z^2$ component is 3 ppm. Therefore, a shim current that generates −3 ppm (⅗ ampere in the preceding embodiment) is applied to the shim coil of the $z^2$ (shim characteristic 5 ppm/A) so as to cancel the non-uniformity of the static magnetic field attributable to the temperature variations of the whole static magnetic field generating magnet 2. In this case also, provided that the shim coil characteristic of the $z^2$ is 5 ppm/A in a similar manner to that of the first embodiment, it is possible to cancel the non-uniformity of the static magnetic field attributable to the temperature characteristics by applying the shim current of ⅗ ampere.

Another example is now considered where the temperature of the space in which the static magnetic field generating magnet 2 is disposed has changed suddenly from the reference temperature 23° C. to 25° C. Non-uniformity of the magnetic field in this case will be corrected immediately after this temperature change. The temperature of the iron yoke 17 is, for example, 23.5° C., which is close to 23° C. However, as the superconducting coil 16 and the connection pipe 19' are constructed of aluminum having a small thermal time constant, their temperature changes to 24.5° C. In this transient state, it is necessary to correct for a total of 8.5 ppm. This is the sum of the error component change of 1.5 ppm of the $z^2$ at 23.5° C. shown in FIG. 9, and the error component change of 7 ppm of the $z^2$ due to the temperature difference 1° C. between the iron yoke 17 and the connection pipe 19' as shown in FIG. 10. When the temperatures of the iron yoke 17 and the connection pipe 19' have become 25° C. with passage of time, only the error component change of 6 ppm of $z^2$ is corrected based on FIG. 9.

As explained above, when the shim current is calculated based on a plurality of detected temperatures and when this calculated current is applied to the shim coil, it is possible to cope with a transient temperature change. By this method, it is possible to maintain the uniformity of the magnetic field of the static magnetic field generating magnet 2 at an optimum level of 5 ppm or lower with extremely high precision.

The above steps 29 to 31 shown in FIG. 2 may be conducted at all times, or may be conducted for a predetermined period of time for each examination. Alternatively, the steps may be conducted only when the temperature variation exceeds a predetermined temperature range.

The above-described control of the shim coils (steps 29 to 31) may be carried out by, for example, a program installed in a computer incorporated in the shim power source 14 or the computer 10 in the MRI apparatus. Alternatively, it may be performed by an analog circuit.

Figure 11:
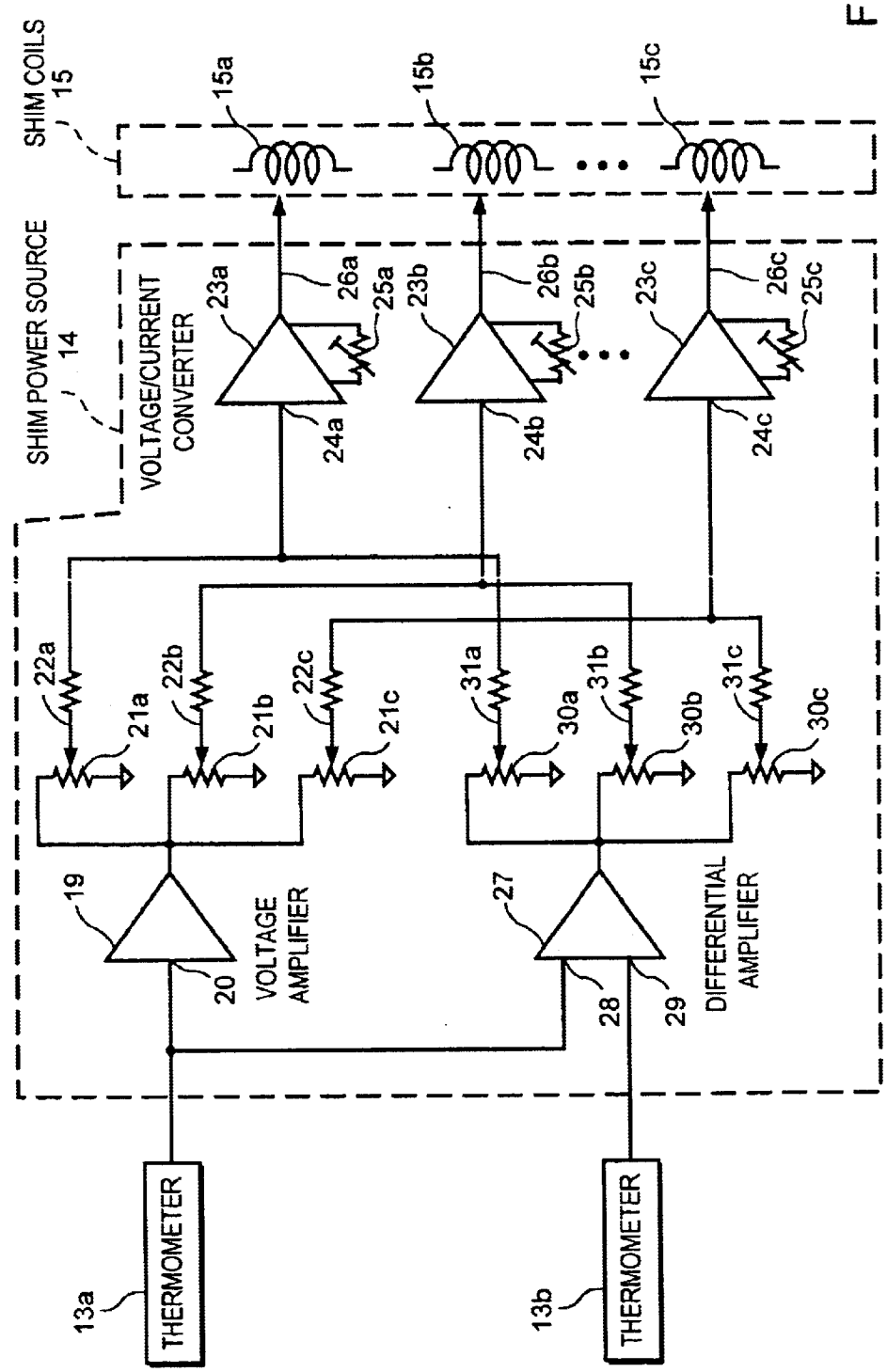
FIG. 11 is a diagram showing details of a magnetic field correcting system of the MRI apparatus shown in FIG. 7.

FIG. 11 shows an embodiment of the shim power source 14 constructed as an analog control circuit. This analog control circuit includes a voltage amplifier 19 that receives an output voltage from a thermometer 13a, and a differential amplifier 27 that is input with the output voltages from the two thermometers 13a and 13b, amplifies the differential voltage between the two voltages and outputs this differential voltage. The analog control circuit further includes a plurality of variable resistors 21a, 21b, 21c, 30a, 30b and 30c that correspond to the plurality of shim coils 15a, 15b and 15c, respectively, and voltage/current converters 23a, 23b and 23c.

When the output voltage Va of the thermometer 13a has been applied to an input terminal 20 of the voltage amplifier 19, the voltage amplifier 19 amplifies this input voltage (Va) by m times. The output voltage after this adjustment is applied to one end of each of the variable resistors 21a to 21c. Namely, the voltage amplifier 19 generates m$\Delta$Va volt each time the temperature increases by 1° C.

On the other hand, when the output voltage Va of the thermometer 13a and the output voltage Vb of the thermometer 13b have been applied to two input terminals 28 and 29 of the differential amplifier 27, the differential amplifier 27 amplifies the differential of these input voltages (Vc=Va−Vb) by n times. In other words, the differential amplifier 27 generates n$\Delta$Vc volt each time the differential temperature increases by 1° C. The output voltage after this adjustment is applied to one end of each of the variable resistors 30a to 30c.

The other ends of the variable resistors 21a to 21c and 30a to 30c are grounded and have voltage of 0. Therefore, it is possible to select any optional value from 0 to mVa for the voltages of the variable terminals 22a to 22c, by adjusting the corresponding variable resistors 21a to 21c. It is also possible to select any optional value from 0 to nVc for the voltages of variable terminals 31a to 31c, by adjusting the corresponding variable resistors 30a to 30c. Voltages of the variable terminals 22a and 31a are applied to an input terminal 24a of the voltage/current converter 23a. Similarly, voltages of the variable terminals 22b and 31b are applied to an input terminal 24b of the voltage/current converter 23b and voltages of the variable terminals 22c and 31c are applied to an input terminal 24c of the voltage/current converter 23c.

Adjustment resistors 25a to 25c for adding constant offset currents to the output currents of the voltage/current converters 23a to 23c are added to these voltage/current converters 23a to 23c respectively. Output terminals 26a to 26c of the voltage/current converters 23a to 23c are connected to the shim coils 15a to 15c that generate correction magnetic field components so that currents from these output terminals 26a to 26c flow to the respective shim coils.

The shim coil characteristic of the shim coil 15a is assumed as follows. The change in the magnetic field when a unit current is passed through the shim coil is $\epsilon 0$ (ppm/A), and the change in the magnetic field per +1° C. of the error component corresponding to the shim coil 15a is $\epsilon 1$ (ppm/QC). Then, the current I1 [A/° C.] necessary to cancel the change in the magnetic field generated by the temperature change of +1° C. is I1=$\epsilon 1/\epsilon 0$. On the other hand, the current I1' that is supplied to the shim coil 15a based on the output m$\Delta$Va[V/° C.] of the voltage amplifier 19 that has detected a temperature change of +1° C. becomes I1'=m$\Delta$Va×r, where x represents the ratio of the output voltage to the input voltage of the variable resistor 21a and r [A/V] represents the conversion factor of the voltage/current converter 23a. Therefore, in order to make I1=I1', the variable resistor 21a is adjusted so that the ratio (x) of the output voltage to the input voltage satisfies the following equation (2).

$$m\alpha Va \cdot x \cdot r = \epsilon 1/\epsilon 0$$

$$x = \epsilon 1/(\epsilon 0 \cdot r \cdot m\Delta Va) \quad (2)$$

Thus, it becomes possible to automatically correct the magnetic field in response to the temperature change.

Similarly, it is assumed that the change in the magnetic field per +1° C. of the temperature difference between the iron yoke 17 and the connection pipe 19' of the error component corresponding to the shim coil 15a is $\epsilon 2$ (ppm/° C.). Then, the current I2 [A/° C.] necessary to cancel the change in the magnetic field generated by the differential temperature change of +1° C. is I2=$\epsilon 2/\epsilon 0$. On the other hand, the current I2' supplied to the shim coil 15a based on the output n$\Delta$Vc[V/° C.] of the voltage amplifier 19 that has detected a temperature change of +10° C. becomes I2'=n$\Delta$Vc·y·r, where y is the ratio of the output voltage to the input voltage of the variable resistor 30a, and r[A/V] is the conversion factor of the voltage/current converter 23a. Therefore, in order to make I2'=I2', the variable resistor 30a is adjusted so that the ratio (y) of the r output voltage to the input voltage satisfies the following equation (3).

$$n\Delta Vc \cdot y \cdot r = \epsilon 2/\epsilon 0$$

$$y = \epsilon 2/(\epsilon 0 \cdot c \cdot n\Delta Vc) \quad (3)$$

Thus, it becomes possible to automatically correct the magnetic field in response to the temperature difference between the iron yoke 17 and the connection pipe 19'.

It is assumed, for example, that the thermometers 13a and 13b produce output voltage of 0.5 volt respectively at the reference temperature, and the inter-terminal voltage increases by 0.2 volt when the temperature increases by 1° C. When the differential amplifier 27 has an amplification factor of ten and also when the difference of temperatures between the two thermometers is 1° C., the differential amplifier 27 generates 2 (0.2×10) volts.

On the other hand, the correction magnetic field of the $Z^2$ component requires 6 ($\epsilon 2$) ppm for a temperature difference of 1° C. between the iron yoke 17 and the connection pipe 19' as shown in FIG. 10. When the shim characteristic 0 of the shim coil 15a of the $z^2$ component is 5 ppm/A, it is necessary to apply a current of 1.2 amperes in order to generate this 6 ppm by the shim coil 15a of the $z^2$ component.

Accordingly, by adjusting the variable terminal 32a of the variable resistor 31a to a position of 60% (y=0.6), the voltage/current converter 23a can generate and supply to the shim coil 15a a current of 1.2 amperes, i.e., the current necessary for generating the correction magnetic field of 6 ppm.

By adjusting the variable resistor 31a in advance as explained above, it is possible to generate the correction magnetic field component of the $z^2$ corresponding to the temperature difference between the iron yoke 17 and the connection pipe 19'. Specifically, in the above example, the 6 ppm of the error component of the $Z^2$ per temperature difference of 1° C. coincides in absolute value with the −6 ppm of the correction magnetic field of the shim coil 15a. Consequently, the uniformity of the magnetic field can be maintained at 5 ppm without being affected by temperature variations.

The maintenance of the uniformity of the magnetic field has been explained with regard to the shim coil 15a as one example. For the y component and other components, a similar adjustment of the variable resistors 21 and 30 can be carried out based on the equations (2) and (3) once the shim characteristic $\epsilon 0$ and the temperature characteristics $\epsilon 1$ and $\epsilon 2$ of the components are given in advance. Thus, it is possible to maintain high uniformity of the magnetic field for all the components. When the shim coil that corrects the y component also works as the gradient magnetic field coil of the y axis, the shim current is superimposed on the gradient magnetic field current that is applied to the gradient magnetic field coil of the y axis at the time of imaging, in a similar manner to that of the first embodiment.

Two embodiments of the present invention have been explained above. In the second embodiment also, a room thermometer may be used as one of the thermometers 13a and 13b similarly to the first embodiment. The number of thermometers is not limited to two. In the second embodiment, the conventional active shimming method may be also operated along with the method of the present invention according to the process shown in FIG. 6.

In this embodiment, it is possible to cope with the temperature change of the static magnetic field generating magnet 2 accompanying the examination with good response. Specifically, when the gradient magnetic field is switched during the examination, an eddy current is induced on the surface of the connection pipe 19' that is positioned near the gradient magnetic field coil 3. This is followed quickly by a temperature change of the connection pipe 19'. However, the examination can be continued in parallel with the correction of the deterioration of the magnetic field uniformity attributable to temperature variation by detecting the temperature difference between the ion yoke 17 and the connection pipe 19'. For deciding the period of measuring the temperature of the static magnetic field generating magnet 2 at step 611 in FIG. 6, a suitable time matching the examination mode can be set since the driving level of the gradient magnetic field can be known beforehand.

The present invention is not limited to the methods and apparatuses explained above and modified within the scope of claims attached to the specification. It is also possible to use the present invention in parallel with other units or methods for maintaining the magnetic field uniformity. For example, although a superconducting coil is used for the static magnetic field generating magnet in the MRI apparatuses shown in FIG. 1 and FIG. 7, an ordinary magnetic field generating magnet or a permanent magnet may also be used for the static magnetic field generating magnet. Although FIG. 1 and FIG. 7 show apparatuses which generate a static magnetic field in a direction orthogonal to the body axis of the object to be examined, the apparatus may generate a static magnetic field in a direction parallel with the body axis of the object.

Further, the numerals used in the above explanation should be construed as merely examples and the present invention is not limited to the numerals.

As explained in the above, according to the present invention, the uniformity of the magnetic field is corrected based on changes in the temperature of the magnet or its surroundings. Therefore, it is possible to maintain the uniformity of the magnetic field at a high level. Particularly, when the temperatures of at least two positions are detected, it is possible to cope with complex and non-uniform temperature changes. As a result, the reliability of the MRI examination data can be increased. Further, according to the present invention, it is possible to efficiently correct only the non-uniformity of the magnetic field attributable to temperature variations, which reduces the imaging time.

What is claimed is:

1. A method for maintaining uniformity of a static magnetic field generated by a static magnetic field generating unit in a magnetic resonance imaging apparatus, by generating an additional magnetic field when said apparatus receives a current from a power source, the method comprising the steps of:

calculating a temperature dependence of the local non-uniformity of distribution of the static magnetic field in an inspection space provided for an object to be examined, said local non-uniformity of distribution of the static magnetic field being caused by temperature change of the static magnetic field generating unit and/or the local surroundings thereof; and detecting a temperature of the static magnetic field generating unit and/or the local surroundings thereof; and generating the additional magnetic field having a magnetic field distribution that corrects said local non-uniformity of the distribution of the static magnetic field within said inspection space, wherein the spatial distribution of the additional magnetic field is adjusted when the current is supplied by the power source to said apparatus, based on the detected temperature of said static magnetic field generating unit and/or the local surroundings thereof.

2. A magnetic resonance imaging apparatus comprising:

a static magnetic field generating means that generates a homogeneous static magnetic field in an inspection space; and a uniformity correcting means that receives a current from a power source, detects temperature change affecting uniformity of the distribution of the static magnetic field generated by the static magnetic field generating means, and generates an additional static magnetic field that cancels local non-uniformity of the distribution of the static magnetic field within said inspection space based on the detected temperature change, wherein a spatial distribution of said additional static magnetic field is adjusted by said uniformity correcting means when the current is supplied by the power source to said uniformity correcting means, based on the temperature change detected by said uniformity correcting means.

3. A magnetic resonance imaging apparatus comprising:

a static magnetic field generating unit that generates a static magnetic field of a predetermined intensity, said static magnetic field generating unit comprising a pair of super conducting coils and a pair of cryostats each accommodating one of said pair of super conducting coils;

a supporting means that supports said pair of cryostats as being apart so as to form an inspection space for an object to be examined;

a gradient magnetic field generating unit that generates a magnetic field having an intensity gradient;

means that generates a high frequency magnetic field;

means that detects nuclear magnetic resonance signals generated from said object;

means that processes said nuclear magnetic resonance signals and that displays the processed results;

a temperature detecting unit that detects a temperature of said static magnetic field generating unit, said support means and/or the local surrounding space thereof;

a magnetic field correcting unit that receives a current from a power source and generates an additional magnetic field that corrects the local non-uniformity of the distribution of said static magnetic field within said inspection space being caused by temperature change of said static magnetic field generating unit, said support means and/or the local surrounding space thereof; and a control unit that controls said magnetic field correction unit based on the temperature detected by said temperature detecting unit, wherein a spatial distribution of said additional magnetic field is adjusted by said magnetic field correcting unit under control of said control unit, when the current is supplied by the power source to said magnetic field correcting unit, based on the temperature detected by said temperature detecting unit of said static magnetic field generating unit, said support means and/or the local surrounding space thereof.

4. A magnetic resonance imaging apparatus according to claim 3, wherein the control unit has a temperature setting unit that sets a temperature detected by the temperature-detecting unit.

5. A magnetic resonance imaging apparatus according to claim 3,
wherein the temperature detecting unit detects temperatures of at least two positions.

6. A magnetic resonance imaging apparatus according to claim 3,
wherein the magnetic field correcting unit comprises a shim coil for generating an additional magnetic field and a shim power source that supplies a current to the shim coil directed by said control unit.

7. A magnetic resonance imaging apparatus according to claim 3,
wherein the control unit comprises a voltage generating unit that generates a voltage corresponding to a non-uniformity component of the magnetic field at the temperature detected by the temperature detecting unit, a voltage/current converter that converts the voltage output by the voltage generating unit to current, and a supplying unit that supplies to the magnetic field correcting unit the current generated from the voltage/current converter.

8. A magnetic resonance imaging apparatus according to claim 3,
wherein the magnetic field correcting unit generates at least one additional magnetic field of linear term of y, quadratic term of z and quartic term of z, where z is the direction of the static magnetic field and y is one direction orthogonal to z.

9. A magnetic resonance imaging apparatus according to claim 3,
wherein the temperature detecting unit is disposed near the static magnetic field generating unit and/or in a room where the static magnetic field generating unit is placed.

10. A magnetic resonance imaging apparatus according to claim 3, further comprising:
a connection pipe which connects the pair of cryostats,
wherein said temperature detecting unit also detects a temperature of the connection pipe and
said control unit controls the magnetic field correcting unit based also on the temperature of the connection pipe.

11. A magnetic resonance imaging apparatus according to claim 10,
wherein said control unit controls the magnetic field correcting unit based on the temperature of the supporting means and the temperature difference between the supporting means and the connection pipe.

12. A magnetic resonance imaging apparatus according to claim 11, wherein said control unit:
finds and adds the correction value of a static magnetic field non-uniformity component caused by the temperature of the supporting means and the correction value of a static magnetic field non-uniformity component caused by the temperature difference between the supporting means and the connection pipe, and
controls the magnetic field correcting unit based on the sum of the correction values.

13. A magnetic resonance imaging apparatus comprising;
a static magnetic field generating unit that generates a static magnetic field of a predetermined intensity, said static magnetic field generating unit including a pair of super conducting coils;
a supporting means that supports said pair of super conducting coils as being apart so as to form an inspection space for an object to be examined;
a gradient magnetic field generating means that generates a magnetic field having an intensity gradient;
means that generates a high frequency magnetic field;
means that detects nuclear magnetic resonance signals generated from said object;
means that processes said nuclear magnetic resonance signals and that displays the processed results;
a temperature detecting unit that detects a temperature of said support means;
a magnetic field correcting unit that receives a current from a power source and generates an additional magnetic field which corrects the local non-uniformity of the distribution of said static magnetic field within said inspection space being caused by deformation of said supporting means due to the temperature change thereof; and
a control unit that controls said magnetic field correction unit based on the temperature detected by said temperature detecting unit,
wherein a spatial distribution of said additional magnetic field is adjusted by said magnetic field correcting unit under control of said control unit, when the current is supplied by the power source to said magnetic field correcting based on the temperature detected by said temperature detecting unit of said support means.

14. A magnetic resonance imaging apparatus comprising:
a static magnetic field generating unit that generates a homogeneous static magnetic field in an inspection space;
a gradient magnetic field generating unit that generates a magnetic field strength gradient;
a high frequency magnetic field generating unit;
a detecting unit that detects nuclear magnetic resonance signals generated from an object to be examined;
a display unit that displays an image as an result based on the detection;
a temperature detecting unit that detects a temperature of said static magnetic field generating unit and/or the local surroundings thereof;
a magnetic field correcting unit that receives a current from a power source and generates an additional magnetic field that corrects local non-uniformity of the distribution of said static magnetic field within said inspection space being caused by temperature change of said static magnetic field generating unit and/or the local surrounding space of it; and
a control unit that controls said magnetic field correcting unit based on the temperature detected by said temperature detecting unit,
wherein a spatial distribution of said additional magnetic field is adjusted by said magnetic field correcting unit under control of said control unit, when the current is supplied by the power source to said magnetic field correcting unit, based on the temperature detected by said temperature detecting unit of said static magnetic field generating unit and/or the local surroundings thereof.

15. A magnetic resonance imaging apparatus according to claim 14,
wherein the control unit has a temperature setting unit that sets a temperature detected by the temperature-detecting unit.

16. A magnetic resonance imaging apparatus according to claim 14, wherein the temperature detecting unit detects temperatures of at least two positions.

17. A magnetic resonance imaging apparatus according to claim 14,
wherein the magnetic field correcting unit comprises a shim coil for generating an additional magnetic field and a shim power source that supplies a current to the shim coil.

18. A magnetic resonance imaging apparatus according to claim 14,
wherein the control unit comprises a voltage generating unit that generates a voltage corresponding to a non-uniformity component of the magnetic field at the temperature detected by the temperature detecting unit, a voltage/current converter that converts the voltage output by the voltage generating unit to current, and a supplying unit that supplies to the magnetic field correcting unit the current generated from the voltage/current converter.

19. A magnetic resonance imaging apparatus according to claim 14,
wherein the magnetic field correcting unit generates at least one additional magnetic field of linear term of y, quadratic term of z and quartic term of z, where z is the direction of the static magnetic field and y is one direction orthogonal to z.

20. A magnetic resonance imaging apparatus according to claim 14,
wherein the temperature detecting unit is disposed near the static magnetic field generating unit and/or in a room where the static magnetic field generating unit is placed.

21. A magnetic resonance imaging apparatus according to any one of claims 14, 3 and 13, wherein said apparatus further comprises:
means that calculates a temperature dependence of a local non-uniformity of distribution of the static magnetic field in the inspection space, said local non-uniformity distribution of the static magnetic field being caused by temperature change of the static magnetic field generating unit and/or the local surrounding space thereof;
means that holds a control data that corrects the local non-uniformity of the distribution of the static magnetic field corresponding to the temperature; and
means that outputs the control data being selected from said control data holding means based on the detected temperature into said control unit.

22. A magnetic resonance imaging apparatus comprising:
a static magnetic field generating unit that generates a static magnetic field of a predetermined intensity in an inspection space, said static magnetic field generating unit comprising a pair of permanent magnets;
a supporting means that supports said pair of permanent magnets as being apart so as to form an inspection space for an object to be examined;
a gradient magnetic field generating unit that generates a magnetic field having an intensity gradient;
means that generates a high frequency magnetic field;
means that detects nuclear magnetic resonance signals generated from said object;
means that processes said nuclear magnetic resonance signals and that displays the processed results;
a temperature detecting unit that detects a temperature of at least one of said static magnetic field generating unit, support means and the local surrounding space of them;
a magnetic field correcting unit that receives a current from a power source and generates an additional magnetic field that corrects the local non-uniformity of the distribution of said static magnetic field within said inspection space being caused by temperature change of said static magnetic field generating unit, said support means and/or said local surrounding space of them; and
a control unit that controls said magnetic field correction unit based on the temperature detected by said temperature detecting unit,
wherein a spatial distribution of said additional magnetic field is adjusted by said magnetic field correcting unit under control of said control unit, when the current is supplied by the power source to said magnetic field correcting unit, based on the temperature detected by said temperature detecting unit of said at least one of said static magnetic field generating unit, support means, and/or the local surrounding space of them.

* * * * *